US007317369B2

(12) United States Patent
Roth et al.

(10) Patent No.: US 7,317,369 B2
(45) Date of Patent: Jan. 8, 2008

(54) SUPERCONDUCTOR MAGNET COIL CONFIGURATION

(75) Inventors: Gerhard Roth, Rheinstetten (DE); Volker Niemann, Straubenhardt (DE); Klaus Schlenga, Linkenheim-Hochstetten (DE)

(73) Assignee: Bruker Biospin GmbH, Rheinstetten (DE)

(*) Notice: Subject to any disclaimer, the term of this patent is extended or adjusted under 35 U.S.C. 154(b) by 157 days.

(21) Appl. No.: 11/214,710

(22) Filed: Aug. 31, 2005

(65) Prior Publication Data
US 2007/0008055 A1 Jan. 11, 2007

(30) Foreign Application Priority Data
Sep. 11, 2004 (DE) ............... 10 2004 043 988

(51) Int. Cl.
*H01F 1/00* (2006.01)
*H01F 6/00* (2006.01)
*H01F 7/00* (2006.01)
(52) U.S. Cl. ............... 335/216; 335/282; 335/299; 174/125.1; 174/128.1; 29/599; 29/605
(58) Field of Classification Search ........ 335/216–219, 335/296–299, 302–306; 174/126.1, 128.1; 29/599, 605
See application file for complete search history.

(56) References Cited

U.S. PATENT DOCUMENTS

| | | | | |
|---|---|---|---|---|
| 2,936,435 A | * | 5/1960 | Buck | 338/32 R |
| 3,283,277 A | * | 11/1966 | Hulm et al. | 335/216 |
| 3,603,716 A | * | 9/1971 | Koren et al. | 174/395 |
| 3,603,718 A | * | 9/1971 | Koren et al. | 174/395 |
| 3,713,211 A | * | 1/1973 | Freeman, Jr. | 29/599 |
| 4,151,498 A | * | 4/1979 | Katsurai | 335/216 |

(Continued)

FOREIGN PATENT DOCUMENTS

JP 58127305 7/1983

(Continued)

OTHER PUBLICATIONS

D. Atherton, "Design of high homogeneity inside-notch-corrected superconducting solenoids", pp. 753-756, Canadian Journal of Physics, vol. 47, No. 7, 1969.

(Continued)

*Primary Examiner*—Lincoln Donovan
*Assistant Examiner*—Mohamad A Musleh
(74) *Attorney, Agent, or Firm*—Paul Vincent

(57) ABSTRACT

A superconducting magnet coil configuration comprising at least one section of a superconducting strip conductor, which is continuously wound in a cylindrical winding chamber (1) between two end flanges (2, 3) in several solenoid-like layers is characterized in that the section comprises an axial region of reduced current density (=notch region (10)), and the winding layers (6, 9) have hollow cylindrical blind regions (4a, 4b, 4c) which are filled with filler and which have different axial lengths, and radially sequential blind regions (4a, 4b, 4c) each alternately abut one of the two end flanges (2, 3) and are each radially separated from each other by at least one continuous winding layer (7), wherein the axial overlapping region of the blind regions (4a, 4b, 4c) forms the notch region (10). The inventive device thereby realizes a magnet coil configuration comprising a strip conductor which has a notch region for correcting inhomogeneities, wherein the mechanical load on the strip conductor is minimized.

17 Claims, 1 Drawing Sheet

U.S. PATENT DOCUMENTS

| | | | |
|---|---|---|---|
| 4,255,849 A * | 3/1981 | Beck et al. | 29/599 |
| 4,271,585 A * | 6/1981 | Satti | 29/599 |
| 4,462,152 A * | 7/1984 | Okamoto et al. | 29/598 |
| 4,561,175 A * | 12/1985 | Kawasumi | 29/605 |
| 4,580,118 A * | 4/1986 | Kawamura | 338/216 |
| 4,679,020 A * | 7/1987 | Kawamura et al. | 335/216 |
| 4,701,736 A * | 10/1987 | McDougall et al. | 335/299 |
| 4,969,064 A * | 11/1990 | Shadowitz | 361/141 |
| 5,293,524 A | 3/1994 | Mookerjee | |
| 5,319,333 A | 6/1994 | Roth | |
| 5,463,291 A * | 10/1995 | Carroll et al. | 315/502 |
| 5,551,144 A * | 9/1996 | Mantone et al. | 29/599 |
| RE36,782 E * | 7/2000 | Brown et al. | 335/216 |
| 6,157,276 A * | 12/2000 | Hedeen et al. | 335/216 |
| 6,553,646 B1 * | 4/2003 | de Rochemont | 29/599 |
| 6,600,398 B2 * | 7/2003 | Roth et al. | 335/216 |
| 6,601,289 B1 * | 8/2003 | Kobayashi | 29/599 |
| 6,646,528 B2 * | 11/2003 | Ehrenberg et al. | 335/216 |
| 6,922,885 B2 * | 8/2005 | Laskaris et al. | 29/605 |
| 7,159,297 B2 * | 1/2007 | Inaishi et al. | 29/598 |
| 2007/0167822 A1 * | 7/2007 | Webler et al. | 600/463 |

FOREIGN PATENT DOCUMENTS

| | | |
|---|---|---|
| JP | 06176924 | 6/1994 |
| JP | 2001006919 | 1/2001 |

OTHER PUBLICATIONS

D. Kabat, Optimisation of inner-notch-corrected highly homogeneous superconducting solenoids and their comparison with other coil configurations, pp. 652-657, Journal of Physics E, vol. 12, No. 7, 1979.

* cited by examiner

SUPERCONDUCTOR MAGNET COIL CONFIGURATION

This application claims Paris Convention priority of DE 10 2004 043 988.5 filed Sep. 11, 2004 the complete disclosure of which is hereby incorporated by reference.

BACKGROUND OF THE INVENTION

The invention concerns a superconducting magnet coil configuration with at least one section of superconducting strip conductor, which is continuously wound in a cylindrical winding chamber between two end flanges in several solenoid-like layers.

Magnet coil configurations of this type are known in the art.

Notches are frequently used to homogenize compact high field magnets via field correction of magnet coil configurations having low-temperature superconductors (LTS). A conventional notch region is designed by initially completely winding the first notch winding on one side of the notch. The wire is then bent sharply and guided axially through the notch. The second notch winding is then wound on the other side.

Highest field strengths are obtained by using strip conductors of high-temperature superconducting (HTS) material in the innermost magnet coil windings. Due to the high mechanical sensitivity of these strip conductors, the notches cannot be conventionally designed in this region. In particular, transfer of the strip conductor from one side of the notch to the other side using the above-described sharp bend and the associated small radius of curvature is not possible with an HTS strip conductor. The mechanical sensitivity of HTS strip conductors is particularly problematic in view of forming a notch region, since damage to the HTS conductor material would result in a costly defect in the overall magnet coil configuration. Undesired inhomogeneities in HTS coils must therefore be compensated for using separate correction coils.

It is therefore the underlying purpose of the invention to propose a magnet coil configuration using a strip conductor which has a notch area for correcting inhomogeneities, wherein the mechanical load on the HTS strip conductor is minimized.

SUMMARY OF THE INVENTION

This object is achieved in accordance with the invention in that the section comprises an axial region of reduced current density (=notch region), the winding layers have hollow cylindrical blind regions with different axial lengths which are filled with filler, and the radially sequential blind regions each alternately abut one of the two end flanges and are each radially separated from each other through at least one continuous winding layer, wherein the axial overlapping region of the blind regions forms the notch region.

Due to the alternating arrangement of the blind regions at one of the two end flanges, the windings are only wound in one winding region at the left-hand or right-hand side of the notch region. These windings in the different winding regions are connected to each other using a continuous winding layer, such that the overall notch winding may be consistently wound without joints. Since the overlapping portion of the blind regions contains only the continuous windings connecting the winding regions, the current density in this region is reduced compared to the winding regions and forms a notch region, thereby avoiding bending of the strip conductor through a small radius of curvature to transfer the strip conductor from one winding region to the next.

In a preferred embodiment, the superconducting strip conductor is a high-temperature superconductor (=HTS) and preferably contains silver-stabilized Bi—Sr—Ca—Cu oxide or YBCO. The advantages of the inventive magnet coil configuration can thereby be utilized very effectively, since HTS conductors are extremely brittle and therefore particularly sensitive to bending through a small radius of curvature, which can be avoided using the present invention.

To obtain a field distribution with optimum symmetry, in a particularly preferred embodiment of the magnet coil configuration, the notch region is axially displaced from a symmetrical configuration in such a manner that the field effects of lower orders, in particular of first order, generated by the continuous winding layer which separates blind regions, are compensated for. Towards this end, the lengths of the blind regions are selected in such a manner that the lowest orders of the asymmetric field errors vanish.

In a further embodiment, the radially innermost blind region is designed in one piece with the winding chamber. Fixing of the radially innermost blind region to the winding chamber is therefore not necessary.

In a particularly preferred embodiment of the invention, winding layers are continuously wound between the end flanges radially outside and/or radially inside of the notch region. The overall magnetic field can thereby be adjusted to the desired strength. If the winding layers are continuously and radially wound within the notch region, the radially innermost blind region cannot be produced in one piece with the winding chamber.

The axial lengths of the blind regions are preferably adjusted to be integer multiples of the windings of the strip conductor. One winding layer thereby always comprises a full number of windings.

To provide optimum homogenization of the field distribution, the blind regions advantageously have different axial lengths and/or radial thicknesses. The compensation provided by the individual blind regions can thereby be exactly adjusted to the field errors of the overall magnet.

In one embodiment of the inventive magnet coil configuration, the blind regions are designed as hollow cylinders made from solid material. In this case, the further blind regions must be disposed at a later time, with the exception of the radially innermost blind region which may be integral with the winding chamber.

In an alternative embodiment, the blind regions are designed as partial shells, preferably half-shells, of hollow cylinders. Half-shells of this type can advantageously be easily disposed onto the corresponding continuous winding in one winding region after winding of the winding layers, without removing one of the end flanges limiting the winding regions.

In a further embodiment of the inventive magnet coil configuration, the blind regions contain wound strips which may e.g. be blind windings of HTS material.

The superconducting strip conductor used for the windings is preferably formed from stacked conductor strips which are electrically connected in parallel, since one individual conductor strip cannot carry sufficient current for the desired applications. The current carrying capacity of the strip conductor winding is thereby increased.

The inventive magnet coil configuration is advantageously superconductingly short-circuited such that a magnetic flux can be frozen.

The inventive magnet coil configuration is preferably a high field NMR magnet in the center of which an extremely homogeneous magnetic field is produced.

Further advantages of the invention can be extracted from the description and the drawing. The features mentioned above and below may be used either individually or collectively in arbitrary combination. The embodiments shown and described are not to be understood as exhaustive enumeration but have exemplary character for describing the invention.

DESCRIPTION OF THE PREFERRED EMBODIMENT

Figure 1:
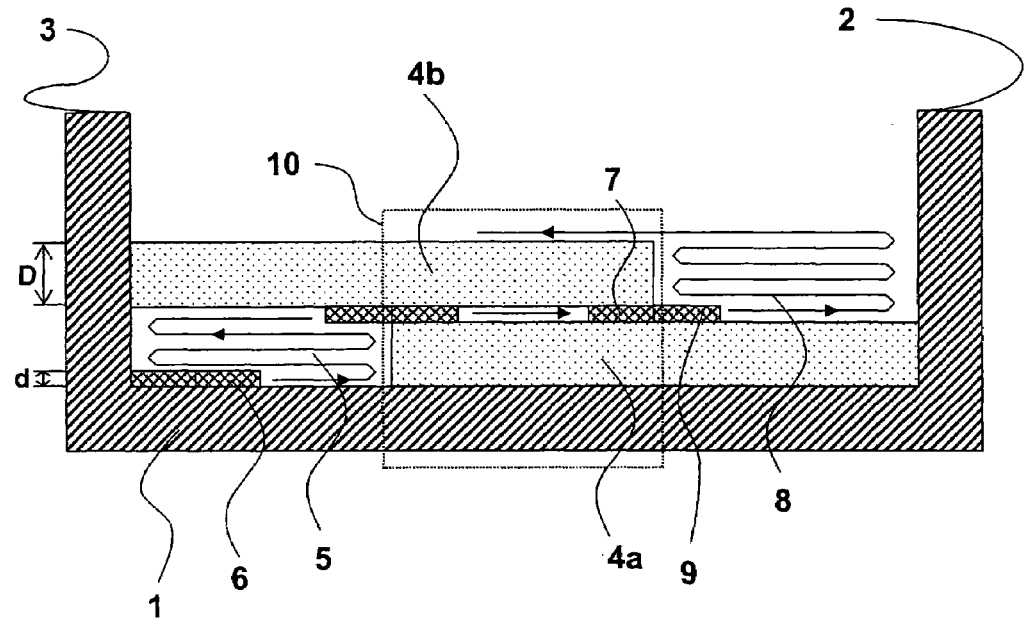
FIG. 1 shows an inventive magnet coil configuration with blind regions of equal sizes.

FIG. 1 shows a magnet coil configuration having a cylindrical winding chamber 1 which is limited by two end flanges 2, 3 and contains blind regions 4a, 4b. The blind regions 4a, 4b consist of a filler and are designed in the form of a hollow cylinder or hollow cylindrical shells. The blind regions 4a, 4b may also be wound in the form of an open coil e.g. of HTS waste material (blind windings). The first blind region 4a abuts the right end flange 2 and can be integrally formed with the winding chamber, e.g. be milled, but may also be screwed or mounted onto the winding chamber in a different manner as a separate part. Together with the left end flange 3, the blind region 4a defines a first winding region 5 in which the strip conductor is wound to the height of the first blind region 4a. The winding layers 6 formed in this manner are only shown at individual selected locations in FIG. 1 for reasons of clarity. The meandering line provided with arrows indicates the further extension of the windings of the strip conductor. The arrows face in one direction which extends substantially perpendicularly to the longitudinal axis of the strip conductor. The strip conductor passes over the existing winding layers 6 and the filler of the first blind region 4a through a continuous winding layer 7 and into a second winding region 8, which is limited by the right end flange 2 and the second blind region 4b. The second blind region 4b may thereby be disposed in the form of the above-described hollow cylindrical shells after winding of the winding layers 6 of the first winding region 5. If the second blind region 4b is a fully hollow cylinder, it is pushed over the continuous winding layer 7, wherein the left end flange 3 must be mounted at a later time. The second winding region 8 is also provided with winding layers 9 of the strip conductor such that, if desired, the strip conductor can be further transferred into another winding region. The blind regions 4a, 4b which limit the winding regions 5, 8 on one side are alternately mounted to the end flanges 2, 3 and axially overlap. This axial overlapping region of the blind regions 4a, 4b in the radial direction represents a region of reduced current density and therefore forms a notch region 10. To realize a configuration with maximum compactness and good stability, the thickness D of the blind regions is an integer multiple of the radial thickness d of the strip conductor. For the same reason, all individual windings of the notch winding preferably have the same slope since change of slope within the winding would create gaps within the winding regions which could cause undesired displacement of the strip conductor.

The blind regions 4a, 4b shown in FIG. 1 have the same size and alternately abut one of the end flanges 2, 3 with the result that the winding radii in the first winding region 5 are smaller and the field strength is correspondingly higher than in the second winding region 8. This results in a slightly asymmetric field distribution. Through slight variation of the winding numbers or of the axial extension of the blind regions 4a, 4b and therefore of the axial position of the winding stacks, the anti-symmetrical field errors generated by the inventive magnet coil configuration can be corrected with high accuracy. The homogeneity of the magnet coil configuration can be adjusted with the same accuracy as with an equivalent conventional notch through adjustment of the winding lengths or of the axial positions of the winding regions 5, 8 in the notch region 10. Possible field errors can be compensated for in this manner.

It is obvious that the inventive construction of the notch region 10 requires a relatively large amount of space compared to conventional notch constructions, since winding layers 6, 9 are only provided on one side of the notch region thereby considerably reducing the winding density (≈half density). Two, four-winding layers are e.g. required to replace a conventional four-layered notch by an inventive notch region 10 (FIG. 1). Since HTS strip conductors have a high current density, the space requirements are not dramatic.

Figure 2:
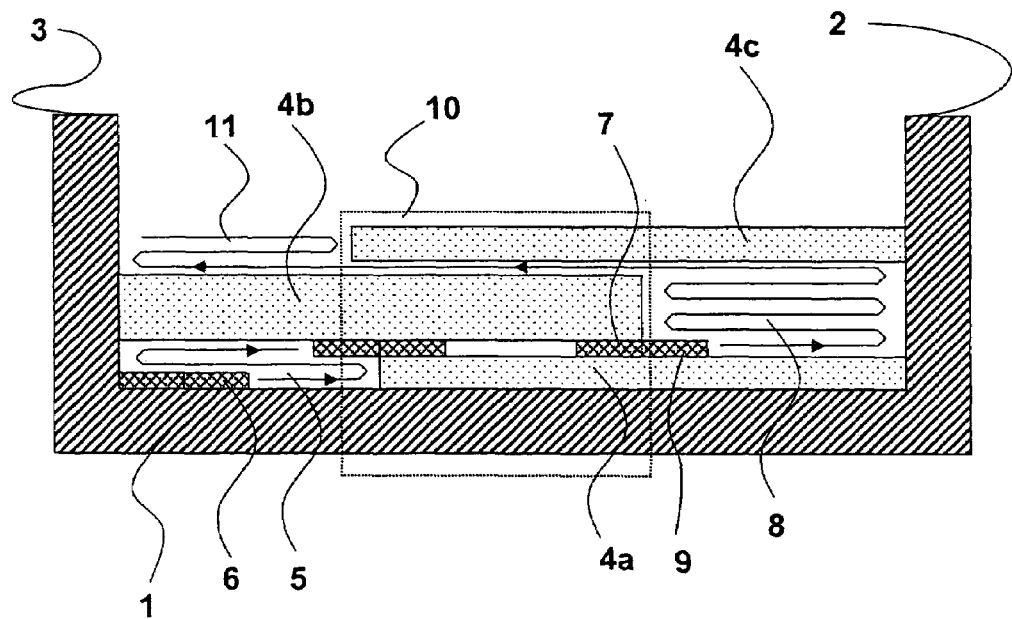
FIG. 2 shows an inventive magnet coil configuration with blind regions of different sizes.

FIG. 2 shows a particularly advantageous way of replacing a conventional four-layered notch by an inventive notch region 10. Three winding stacks are alternately disposed for this purpose. The first two winding layers 6 are wound in the first winding region 5 followed by a continuous winding layer 7 disposed over the existing winding layers 6 and over the blind region 4a. The second winding region 8 comprises four winding layers which are themselves surrounded by a continuous winding layer which passes the strip conductor into a third winding region 11. This third winding region 11 is bordered by a blind region 4c and the end flange 3 and accepts two further winding layers. Field correction is effected through selection of the width of the notch region 10, as in conventional notches. The anti-symmetrical field errors caused by the different winding radii are compensated for in that the axial extensions of the blind regions 4a, 4b, 4c are different.

The inventive winding of the strip conductor in the winding regions 5, 8, 11 which are alternately disposed relative to the winding chamber permits construction of a notch region 10 within a superconducting magnet coil configuration containing HTS materials and therefore homogenization of a compact high field magnet.

| List of Reference Numerals | |
|---|---|
| 1 | winding chamber |
| 2 | end flange |
| 3 | end flange |
| 4a, b, c | blind regions |
| 5 | first winding region |
| 6 | winding layer |
| 7 | continuous winding layer |
| 8 | second winding region |
| 9 | winding layer |
| 10 | notch region |
| 11 | third winding region |
| d | thickness of the strip conductor |
| D | thickness of the blind regions |

We claim:

1. A superconducting magnet coil configuration comprising:
   a first end flange;
   a second end flange, said first and said second end flanges defining and limiting a substantially cylindrical winding chamber;
   a first hollow cylindrical filler, said first filler having a first filler inside radius, a first filler outside radius, a first filler first end, and a first filler second end, said first filler second end disposed adjacent to said second end flange, said first filler defining and limiting a first winding chamber portion between said first end flange and said first filler first end;
   a second hollow cylindrical filler, said second filler having a second filler inside radius, a second filler outside radius, a second filler first end, and a second filler second end, said second filler disposed within said winding chamber substantially coaxially with respect to said first filler, said second filler inside radius being greater than said first filler outside radius, wherein said second filler first end is disposed adjacent to said first end flange, said second filler defining and limiting a second winding chamber portion between said second end flange and said second filler second end, said second chamber portion disposed radially outside of said first filler; and
   a superconducting strip conductor continuously wound in several solenoid like layers within said first chamber portion and within said second chamber portion and passing through an overlapping axial region between said first filler and said second filler to travel from said first chamber portion into said second chamber portion, wherein said overlapping axial region defines a notch region of reduced current density, said first filler creating a first blind region and said second filler creating a second blind region.

2. The magnet coil configuration of claim 1, wherein said first and said second fillers have differing axial lengths.

3. The magnet coil configuration of claim 1, further comprising at least one additional third filler disposed radially beyond said second filler to define at least one additional third blind region, wherein radially sequential blind regions alternately abut against said first and said second end flanges.

4. The magnet coil configuration of claim 1, wherein said superconducting strip conductor is a high-temperature superconductor.

5. The magnet coil configuration of claim 4, wherein said strip conductor contains silver-stabilized Bi—Sr—Ca—Cu oxide or YBCO.

6. The magnet coil configuration of claim 1, wherein said notch region is axially displaced from a symmetrical configuration in such a manner that field effects of first order generated by said continuous winding layers extending between said first and said second blind regions are compensated for.

7. The magnet configuration of claim 1, wherein a radially innermost blind region is formed in one piece with said winding chamber.

8. The magnet coil configuration of claim 1, wherein winding layers are continuously wound between said first and said second end flanges radially outside and/or radially inside of said notch region.

9. The magnet coil configuration of claim 1, wherein axial lengths of said blind regions are adjusted to be integer multiples of windings of said strip conductor.

10. The magnet coil configuration of claim 1, wherein said blind regions have different axial lengths and/or radial thicknesses.

11. The magnet coil configuration of claim 1, wherein said blind regions are designed as hollow cylinders of solid material.

12. The magnet coil configuration of claim 1, wherein said blind regions are designed as partial shells of hollow cylinders.

13. The magnet coil configuration of claim 12, wherein said partial shells are half-shells.

14. The magnet coil configuration of claim 1, wherein said blind regions contain wound strips.

15. The magnet coil configuration of claim 1, wherein said superconducting strip conductor is formed from stacked conductor strips which are electrically connected in parallel.

16. The magnet coil configuration of claim 1, wherein the magnet coil configuration is superconductingly short-circuited.

17. The magnet coil configuration of claim 1, wherein the magnet coil configuration is a high field NMR magnet in a center of which a highly homogeneous magnetic field is generated.

* * * * *